(12) United States Patent
Bouamama et al.

(10) Patent No.: US 10,635,848 B1
(45) Date of Patent: Apr. 28, 2020

(54) SYSTEM AND METHOD FOR ELECTRICALLY AND SPATIALLY AWARE PARASITIC EXTRACTION

(71) Applicant: Cadence Design Systems, Inc., San Jose, CA (US)

(72) Inventors: Abdelhakim Bouamama, San Jose, CA (US); Raja Mitra, Cupertino, CA (US); Jian Wang, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1047 days.

(21) Appl. No.: 14/525,585

(22) Filed: Oct. 28, 2014

(51) Int. Cl.
*G06F 17/50* (2006.01)
*G06F 30/39* (2020.01)
*G06F 30/398* (2020.01)

(52) U.S. Cl.
CPC ............ *G06F 30/39* (2020.01); *G06F 30/398* (2020.01)

(58) Field of Classification Search
None
See application file for complete search history.

(56) References Cited

U.S. PATENT DOCUMENTS

| | | | | |
|---|---|---|---|---|
| 6,230,299 B1 * | 5/2001 | McSherry | ............ | G06F 17/5081 716/115 |
| 6,243,653 B1 * | 6/2001 | Findley | ............. | G01R 27/2605 702/65 |
| 6,446,239 B1 * | 9/2002 | Markosian | .......... | G06F 17/5072 716/122 |
| 6,941,531 B1 * | 9/2005 | Teig | .................... | G06F 17/5036 716/115 |
| 7,051,293 B1 * | 5/2006 | Teig | .................... | G06F 17/5068 716/113 |
| 8,645,896 B1 * | 2/2014 | Suri | .................... | G06F 17/5081 716/136 |
| 8,978,003 B1 * | 3/2015 | Fu | ....................... | G06F 17/5072 716/111 |
| 8,984,468 B1 * | 3/2015 | Su | ....................... | G06F 17/5036 703/14 |
| 9,396,301 B1 * | 7/2016 | Lee | ..................... | G06F 17/5077 |
| 2009/0031271 A1 * | 1/2009 | White | ................. | G06F 17/5068 716/122 |

(Continued)

*Primary Examiner* — Doon Y Chow
*Assistant Examiner* — Phuong N Hoang
(74) *Attorney, Agent, or Firm* — Mark H. Whittenberger, Esq.; Holland & Knight LLP

(57) ABSTRACT

The present disclosure relates to a computer-implemented method for parasitic extraction. The method may include providing, using one or more processors, an electronic design having IP and/or metal fill content associated therewith. The method may further include identifying at least one layer associated with the content to be modeled and identifying at least one layer associated with the content to be ignored. The method may also include discarding one or more shapes associated with the at least one layer associated with the content to be modeled and replacing each discarded shape with an alternative shape. The method may further include modeling the electronic design including the alternative shape, wherein modeling is electrically aware in a horizontal and a vertical direction. The method may further include a spatial modeling approach where non-extractable shapes are exclusively grouped across the design area including multiple layers, keeping configurable spatial separation between neighboring extractable shapes.

16 Claims, 6 Drawing Sheets

(56) References Cited

U.S. PATENT DOCUMENTS

| | | | |
|---|---|---|---|
| 2009/0307639 A1* | 12/2009 | Chapman | G06F 17/5045 716/136 |
| 2014/0173543 A1* | 6/2014 | Buck | G06F 17/5081 716/115 |
| 2014/0351779 A1* | 11/2014 | Ren | G06F 17/5068 716/115 |
| 2015/0186591 A1* | 7/2015 | Gurney | G06F 17/5036 716/116 |
| 2015/0278428 A1* | 10/2015 | Wang | G06F 17/5081 716/112 |

* cited by examiner

US 10,635,848 B1

SYSTEM AND METHOD FOR ELECTRICALLY AND SPATIALLY AWARE PARASITIC EXTRACTION

FIELD OF THE INVENTION

The present disclosure relates to electronic design simulation, and more specifically, to a method for parasitic extraction during an electronic design simulation.

DISCUSSION OF THE RELATED ART

Electronic design automation (EDA) utilizes software tools that may be used in the design and analysis of numerous electronic systems such as printed circuit boards (PCBs) and integrated circuits (ICs). Verification environments include constraints that describe the relationship between the variables that control the simulation (and sometimes the data that is used as well). For example, in order to verify certain IC designs many simulations are run, which may verify different aspects of the design being tested. Each test may run for a certain amount of design time (usually measured in clock cycles) and a certain amount of user time.

Electronic designs are having significant IP integration for faster and predictable design closure. This leads to huge graphic database system (GDS)/Open Artwork System Interchange Standard (OASIS) macros in the digital designs that are traditionally library exchange format (LEF)/design exchange format (DEF) based. In addition, with the advancement of technology nodes and stringent manufacturing requirements, the fill data is also increasing disproportionately. It is common to have Macro and Fill data in tens of gigabytes in compressed gzipped form. This voluminous data poses significant problems, such as, a slowdown for EDA analysis tools like parasitic extraction, which increases the signoff cycle time for designers. Parasitic extraction tools require significant machine resources to analyze such designs. Moreover, Macro and Fill data are integral parts of an electronic design and if arbitrarily ignored, would result in severe parasitic extraction inaccuracy. This data may generate billions of polygonal shapes and there is no well defined, closed form correlation between the macro/fill shapes and the extraction results of nets in the design. Handling this large amount of macro/fill data is extremely challenging for engineers and designers.

SUMMARY

In one or more embodiments of the present disclosure, a computer-implemented method for parasitic extraction is provided. The method may include providing, using one or more processors, an electronic design having content associated therewith, wherein the content includes at least one of IP content and metal fill content. The method may further include identifying at least one layer associated with the content to be modeled and identifying at least one layer associated with the content to be ignored. The method may also include discarding some or all of the shapes associated with the at least one layer associated with the content to be modeled and replacing each discarded shape with an alternative shape. The method may further include modeling the electronic design including the alternative shape, wherein modeling is electrically aware in a horizontal direction and vertical direction.

One or more of the following features may be included. In some embodiments, modeling may be performed during a pre-processing stage associated with a parasitic extraction phase of the electronic design. In some embodiments, modeling may be configurable based upon, at least one of, a design process, a design pattern, and a downstream electronic design automation tool. The method may include performing parallel processing of the electronic design concurrently during modeling. In some embodiments, identifying at least one layer associated with the content to be ignored may be based upon, at least in part, a pre-characterized electric dependency of a shape in the at least one layer with one or more shapes in an adjacent layer.

In some embodiments, a computer-readable storage medium for parasitic extraction is provided. The computer-readable storage medium may have stored thereon instructions, which when executed by a processor result in one or more operations. Operations may include providing, using one or more processors, an electronic design having content associated therewith, wherein the content includes at least one of IP content and metal fill content. Operations may further include identifying at least one layer associated with the content to be modeled and identifying at least one layer associated with the content to be ignored. Operations may also include discarding some or all of the shapes associated with the at least one layer associated with the content to be modeled and replacing each discarded shape with an alternative shape. Operations may further include modeling the electronic design including the alternative shape, wherein modeling is electrically aware in a horizontal direction and vertical direction.

One or more of the following features may be included. In some embodiments, modeling may be performed during a pre-processing stage associated with a parasitic extraction phase of the electronic design. In some embodiments, modeling may be configurable based upon, at least one of, a design process, a design pattern, and a downstream electronic design automation tool. Operations may include performing parallel processing of the electronic design concurrently during modeling. In some embodiments, identifying at least one layer associated with the content to be ignored may be based upon, at least in part, a pre-characterized electric dependency of a shape in the at least one layer with one or more shapes in an adjacent layer.

In one or more embodiments of the present disclosure, a computer-implemented method for parasitic extraction is provided. The method may include providing, using one or more processors, an electronic design having content associated therewith, wherein the content includes at least one of IP content and metal fill content and partitioning the electronic design into a grid-based bitmap, wherein each grid includes a unique identifier. The method may also include expanding a length and width of each grid by a predetermined amount and determining if the expanded grid includes unextractable nets. If the expanded grid includes unextractable nets, the method may include discarding all of the shapes associated with the expanded grid. The method may further include modeling the electronic design, wherein modeling is spatially aware in a horizontal and vertical direction.

One or more of the following features may be included. In some embodiments, modeling may be performed during a pre-processing stage associated with a parasitic extraction phase of the electronic design. In some embodiments, modeling may include an analysis of multiple layers in each grid. The method may include performing parallel processing of the electronic design concurrently during modeling. The method may include determining a grid size based upon, at least in part, a geometric dimension of the electronic design and a computational requirement.

In some embodiments, a computer-readable storage medium for electronic design simulation is provided. The computer-readable storage medium may have stored thereon instructions, which when executed by a processor result in one or more operations. Operations may include providing, using one or more processors, an electronic design having content associated therewith, wherein the content includes at least one of IP content and metal fill content and partitioning the electronic design into a grid-based bitmap, wherein each grid includes a unique identifier. Operations may also include expanding a length and width of each grid by a pre-determined amount and determining if the expanded grid includes unextractable nets. If the expanded grid includes unextractable nets, operations may include discarding all of the shapes associated with the expanded grid. Operations may further include modeling the electronic design, wherein modeling is spatially aware in a horizontal and vertical direction.

One or more of the following features may be included. In some embodiments, modeling may be performed during a pre-processing stage associated with a parasitic extraction phase of the electronic design. In some embodiments, modeling may include an analysis of multiple layers in each grid. Operations may include performing parallel processing of the electronic design concurrently during modeling. Operations may include determining a grid size based upon, at least in part, a geometric dimension of the electronic design and a computational requirement.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
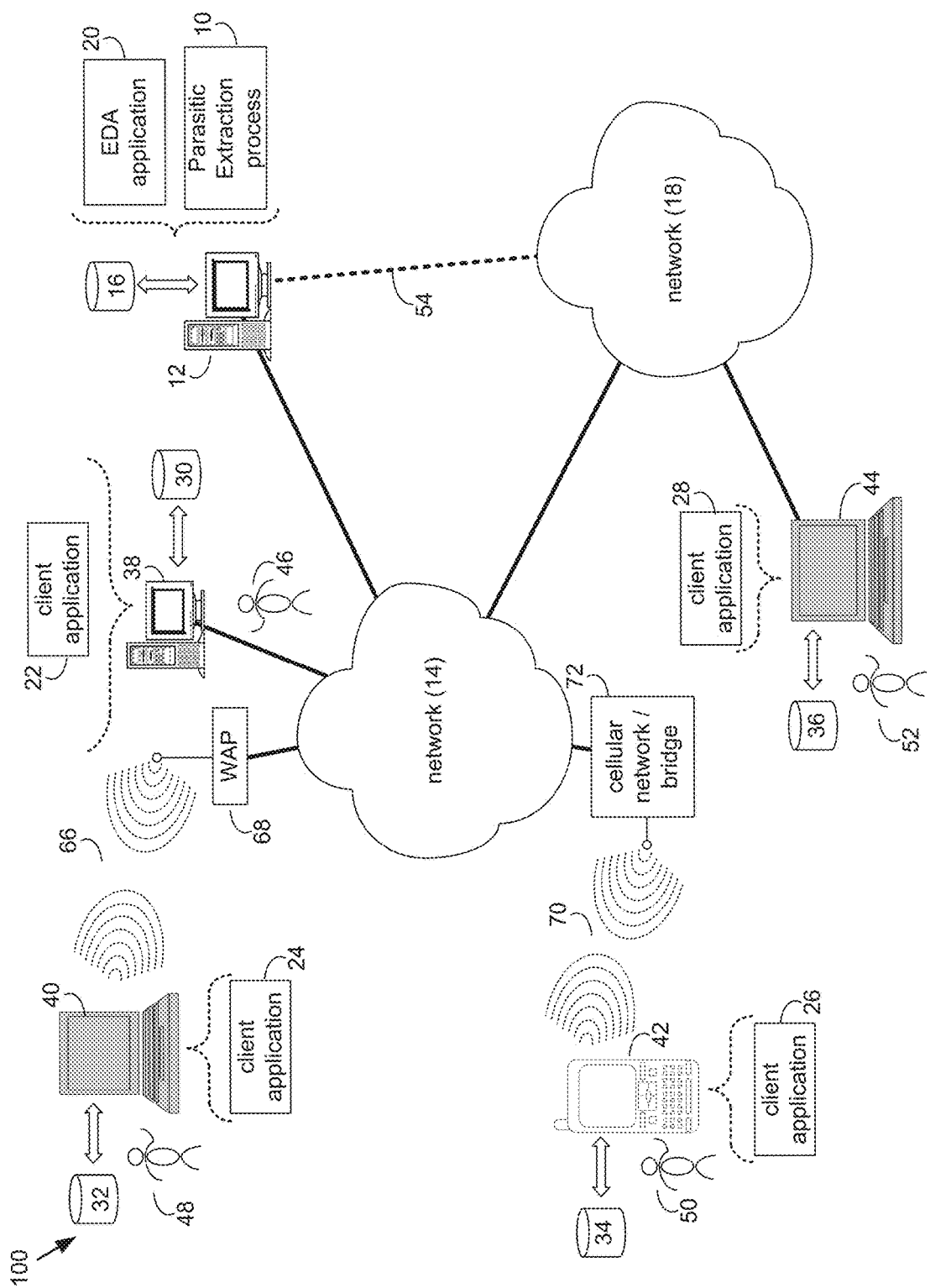
FIG. 1 is a system diagram depicting aspects of the parasitic extraction process in accordance with an embodiment of the present disclosure.

Embodiments of the present disclosure relate to circuit parasitic extraction techniques. More specifically, embodiments of parasitic extraction process 10 may provide a circuit designer with parasitic extraction tools to rapidly extract circuit parasitics by being electrically and spatially aware of the environment while handling voluminous IP and/or FILL data.

Accordingly, in some embodiments, a circuit analysis system may be configured to electrically analyze the geometric environment and model the IP and FILL content of the electronic design to reduce the quantity of data to be analyzed. In this way, parasitic extraction process 10 is time, space and memory efficient. The modeling approaches described herein may be configurable based on the design process, design pattern as well as electronic design automation tools. Further, as a consequence of the modeling process, the quality of parasitic extraction results is accurate and the parasitic extraction process is faster.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, there is shown a parasitic extraction process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the parasitic extraction process may reside on and be executed, in whole or in part, by a client electronic device, such as a personal computer, notebook computer, personal digital assistant, or the like.

The instruction sets and subroutines of parasitic extraction process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for report generation. EDA application 20 may be referred to herein as a design tool.

Parasitic extraction process 10 may be a stand alone application, or may be an applet/application/script that may interact with and/or be executed within EDA application 20. In addition/as an alternative to being a server-side process, the parasitic extraction process may be a client-side process (not shown) that may reside on a client electronic device (described below) and may interact with an EDA client application (e.g., one or more of EDA client applications 22, 24, 26, 28). Further, the parasitic extraction process may be a hybrid server-side/client-side process that may interact with EDA application 20 and an EDA client application (e.g., one or more of client applications 22, 24, 26, 28). As such, the parasitic extraction process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize parasitic extraction process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
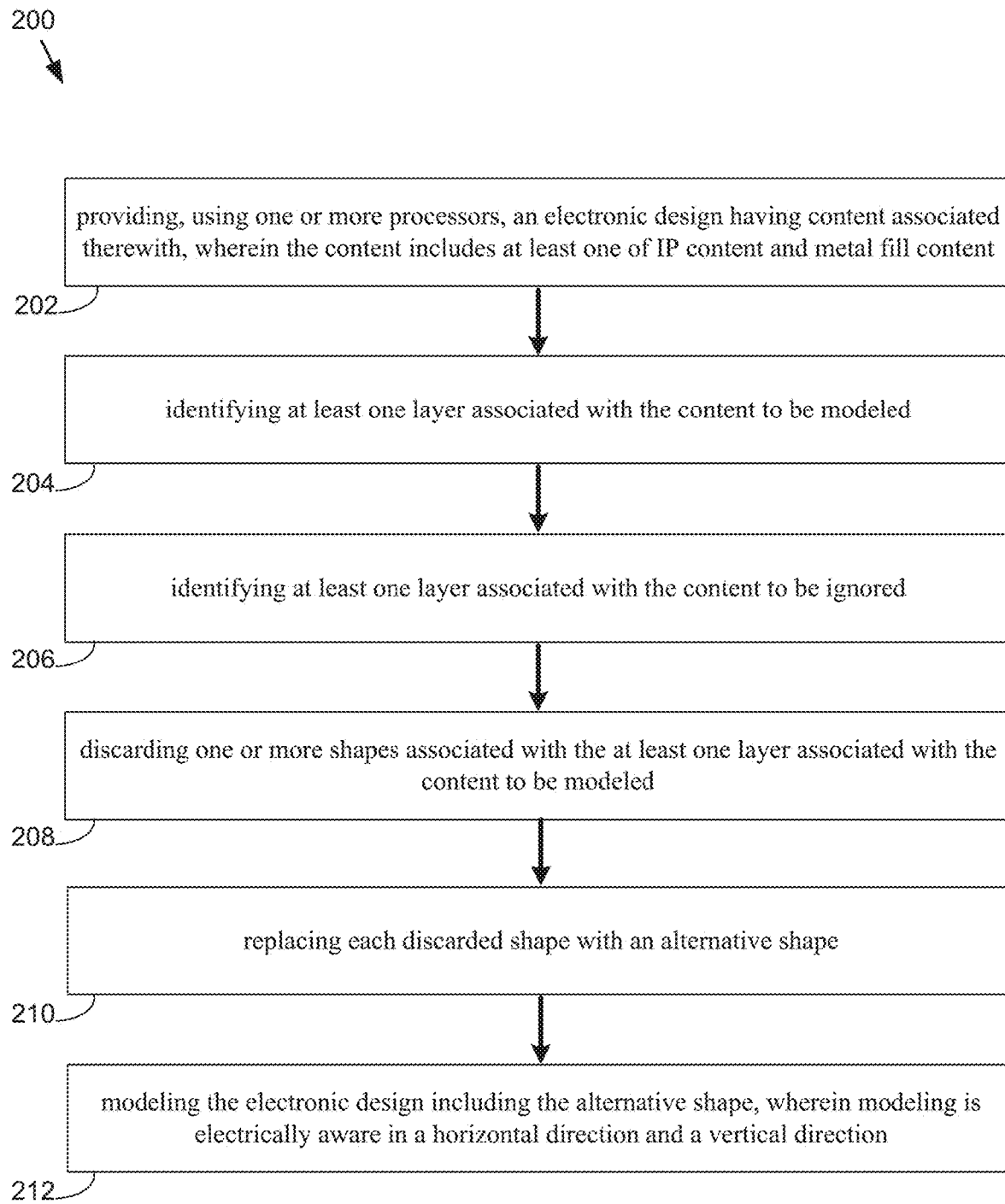
FIG. 2 is a flowchart depicting operations consistent with the parasitic extraction process of the present disclosure.

Referring now to FIG. 2, an embodiment of parasitic extraction process 10 including an electrical modeling approach is provided. The process may include providing (202), using one or more processors, an electronic design having IP and/or metal fill content associated therewith. The method may further include identifying (204) at least one layer associated with the IP content to be modeled and identifying (206) at least one layer associated with the IP content to be ignored. The method may also include discarding (208) some or all of the shapes associated with the at least one layer associated with the IP content to be modeled and replacing (210) each discarded shape with an alternative shape. The method may further include modeling (212) the electronic design including the alternative shape, wherein modeling is electrically aware in a horizontal and vertical direction.

Figure 3:
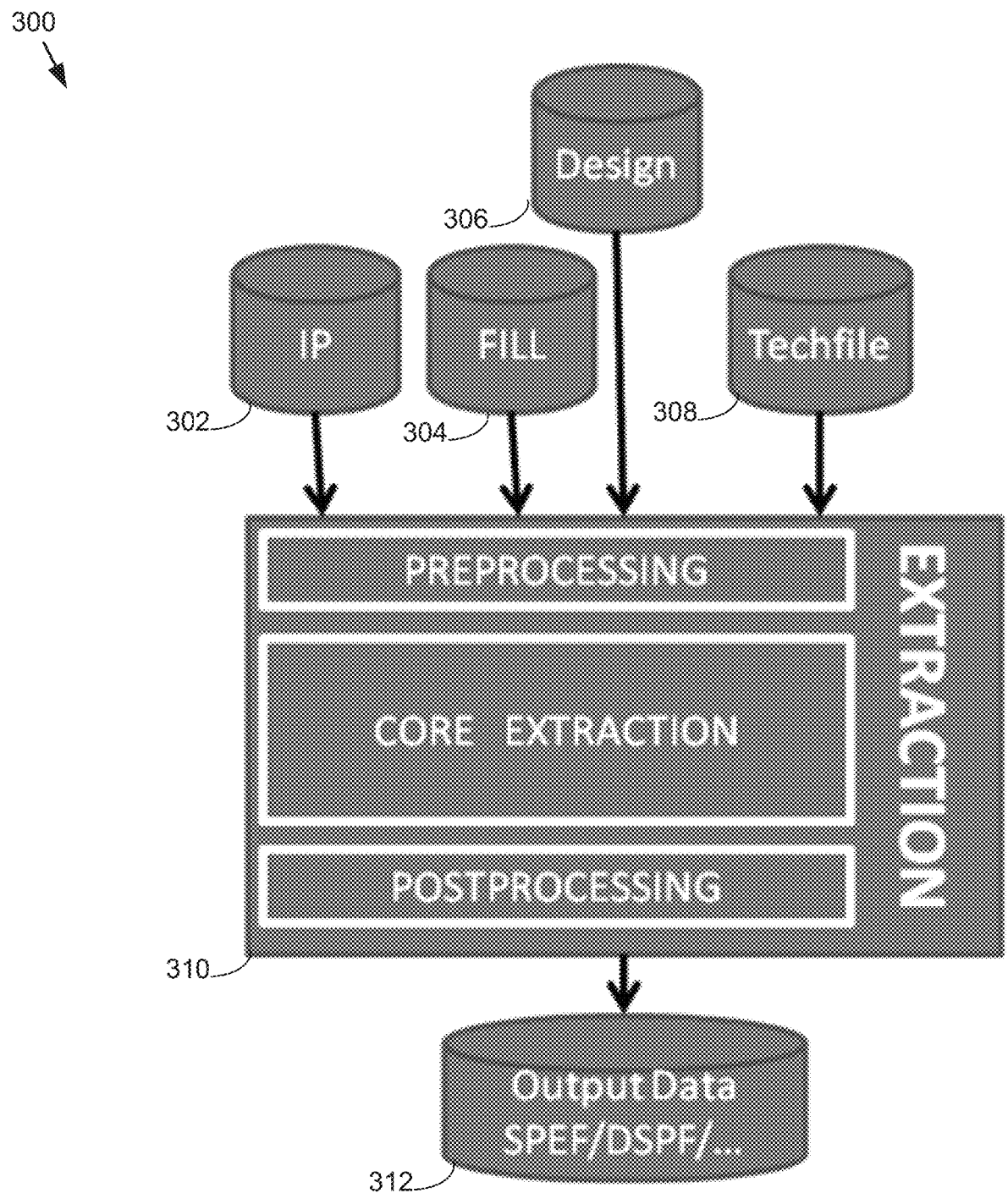
FIG. 3 is a system diagram depicting aspects of the parasitic extraction process in accordance with an embodiment of the present disclosure.

Referring also to FIG. 3, an embodiment 300 depicting an example of parasitic extraction consistent with parasitic extraction process 10 is provided. As is shown, parasitic extraction process 10 may include a number of inputs, some of which may include, but are not limited to, IP data 302 (e.g., from design company, third party vendors, etc.), FILL data 304 (e.g., "macro", "dummy fill", virtual fill, etc.), electronic design data 306, and Techfile data 308 (e.g., setup, etc.). Extraction module 310 may include a number of stages such as the preprocessing, core extraction, and postprocessing stages shown in FIG. 3. Extraction module 310 may generate output data 312, which may take on any suitable form, for example, standard parasitic exchange format (SPEF), detailed standard parasitic format (DSPF), etc.

As discussed above, IP and FILL data may consume large quantities of space (e.g., tens of gigabytes in compressed gzipped form) and, as a result, may have a significant impact on preprocessing and extraction runtime. For very large designs the preprocessing time may often outweigh the core extraction time in terms of computation time and memory.

Figure 4:
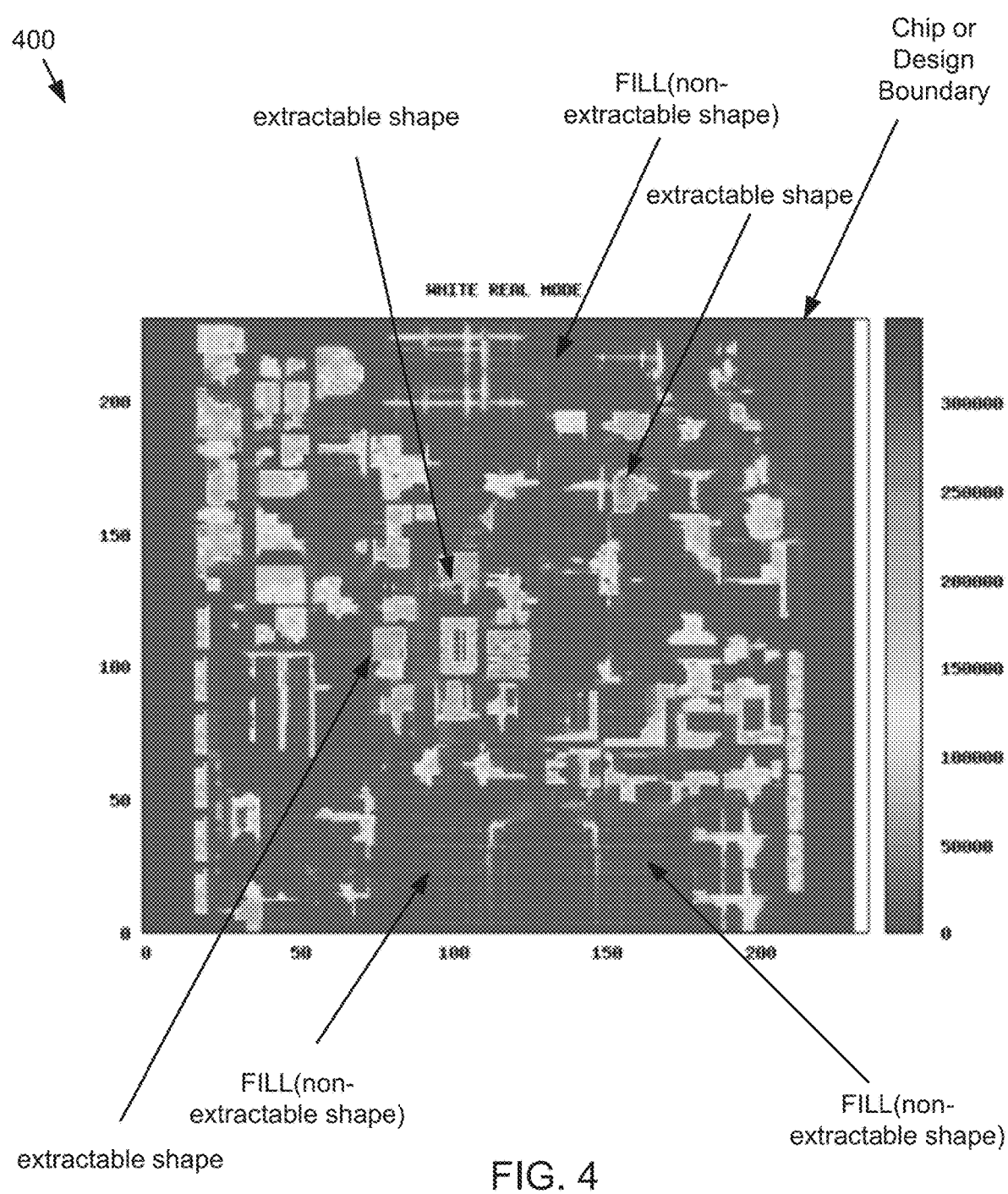
FIG. 4 is a diagram of a density map in accordance with an embodiment of the present disclosure.

Referring now to FIG. 4, an example depicting a density map 400 of geometric objects associated with an electronic design is provided. More specifically, map 400 illustrates the density map of geometric objects across the die area. As shown, the design is dense with nets and IP and fill data filling up the die area. Unless this is intelligently modeled, the data processing and extraction cost would be very high in terms of time, memory and disk space.

Figure 5:
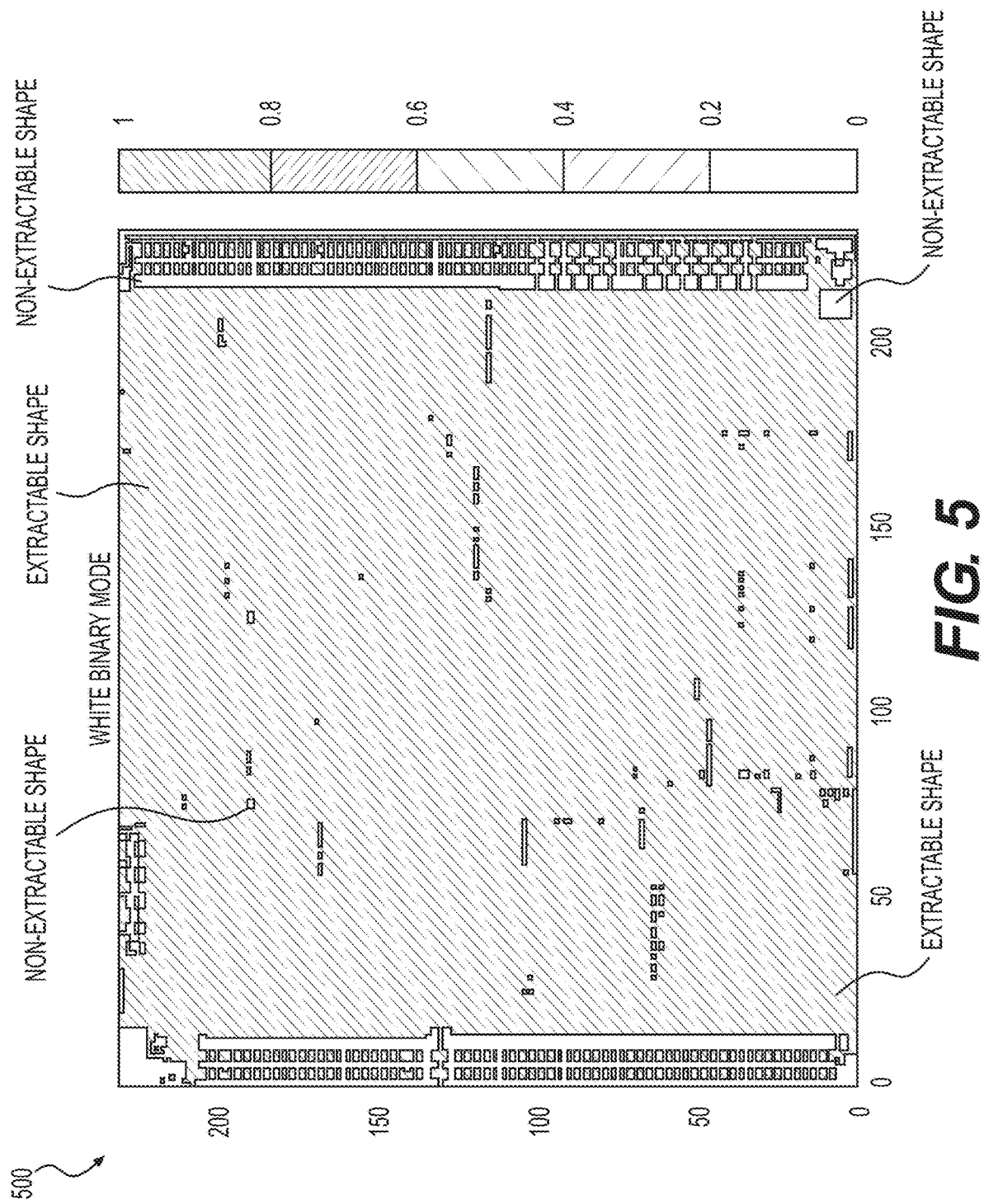
FIG. 5 is a diagram of a density map in accordance with an embodiment of the present disclosure.

Referring also to FIG. 5, an example of a density map 500 of geometric objects across the die area when the data is spatially modeled is provided. The design may be partitioned into grids and the grids with extractable and non-extractable shapes being visibly depicted on map 500.

Embodiments of parasitic extraction process 10 may be configured to electrically and spatially analyze the surrounding environment of the concerned geometric objects and efficiently model it. The approaches for electrically and spatially modeling are discussed in further detail herein.

Referring again to FIG. 2, an embodiment of parasitic extraction process 10 depicting an electrical modeling approach for IP blocks in the electronic design is provided. Accordingly, for each IP block in the design, parasitic extraction process 10 may be configured to determine each layer that does not belong to the consecutive top few layers of the IP blocks. This may be achieved using any suitable approach. For example, using a pre-characterized electric dependency lookup of the shapes in a layer with the shapes in adjacent layers. The pre-characterized electric dependency lookup can be constructed independent of a specific design and based on the technology file associated with a process node. Parasitic extraction process 10 may further include discarding some or all of the shapes in the layer and replacing it with an alternative representation. Some alternative representations may include, but are not limited to, LEF Obstruction (OBS) shapes, if available, as well as, a rectangular metal plate with dimension of the maximum bounding box of the shapes of that layer, for example, if LEF OBS shapes are not available. In some embodiments, the number of consecutive top layers to be ignored may depend on the pre-characterized electric dependency of the shape in a layer with shapes in adjacent layers. In other words, parasitic extraction process 10 may be configured to determine which layers to model and which layers to ignore.

In some embodiments, this modeling may be electrically aware, that is sensitive to and adaptive of the electrical interference in both a horizontal (e.g., x, y) as well as a vertical (e.g., z) direction. In other words, the modeling takes care of the electrical coupling between shapes in a particular layer to the other shapes in the same layer (horizontal awareness) or adjacent layer (vertical awareness). The omission of the top few layers may preserve the accuracy of parasitic extraction for the nets involved in the 'above the IP' routing (e.g., where a silicon layer includes an electrical wire above it). The discarding of lower layer shapes in the IP and suitable replacement by LEF OBS (if available) or metal plate (if LEF OBS is unavailable) preserves the accuracy of horizontal adjacent nets.

In some embodiments, the layer based modeling of shapes in IP blocks may be performed at the early stage of design analysis (e.g. at a pre-processing stage) so as to significantly reduce the memory/disk footprint for handling large amount of data across the flow from preprocessing to geometric search/scan and model evaluation in the core extraction.

In some embodiments, the electrical modeling approach of parasitic extraction process 10 may allow for modeling of IP Blocks and Metal Fills in a design, for rapid, memory efficient and disk space efficient parasitic extraction. The process may preserve signoff accuracy of extraction results and modeling may be configurable based on the design process (e.g., technology nodes such as 28 nm, 14 nm etc.), design pattern (e.g., SOC, high accuracy blocks, etc.) as well as downstream electronic design automation tools (e.g., timing signoff, etc.). Additionally and/or alternatively, parasitic extraction process 10 may allow for parallel exploration (e.g., with multiple CPUs) of the design while performing electrical modeling.

Figure 6:
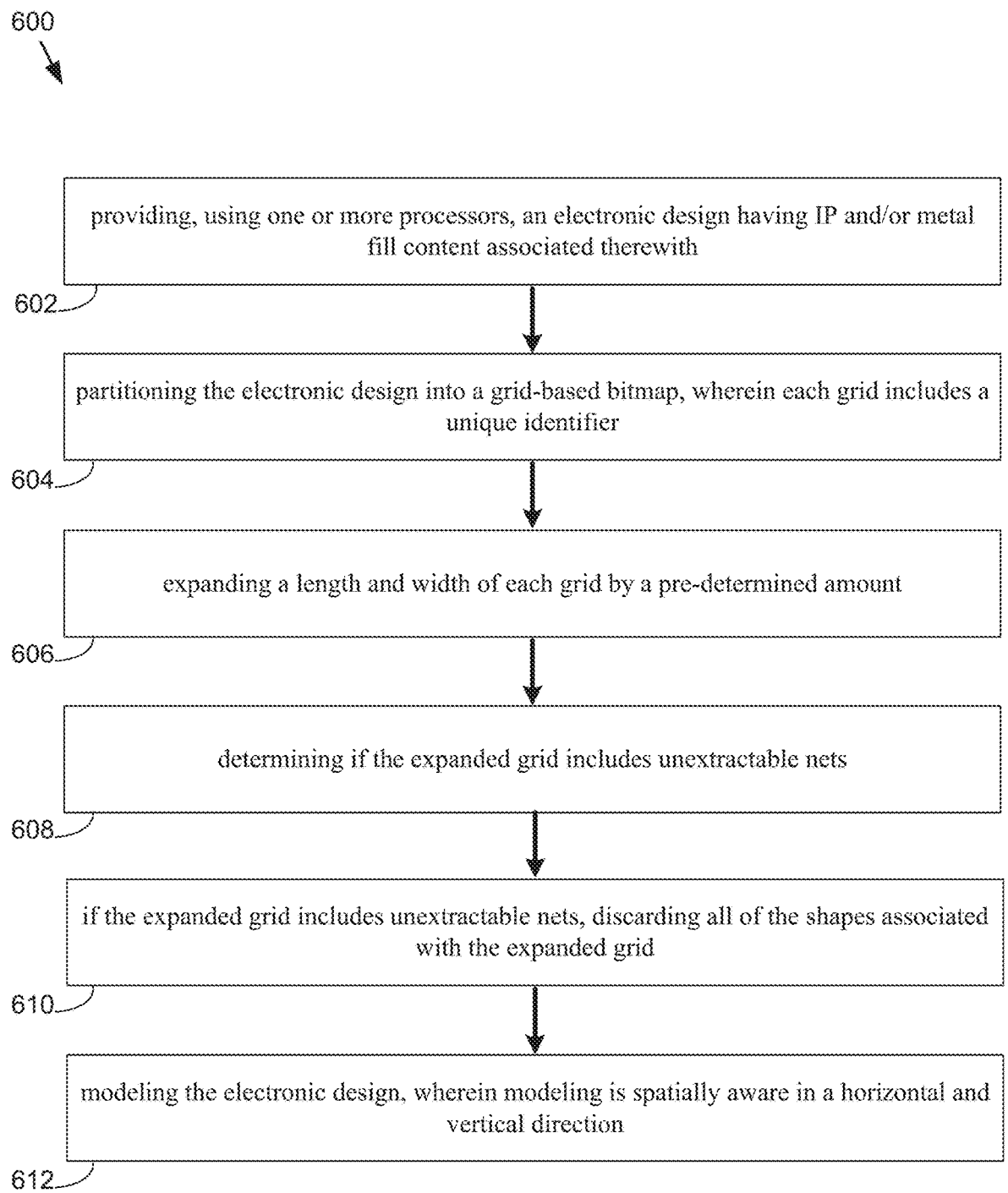
FIG. 6 is a flowchart depicting operations consistent with the parasitic extraction process of the present disclosure.

Referring also to FIG. 6, an embodiment of parasitic extraction process 10 including a spatial modeling approach is provided. The process may include providing (602), using one or more processors, an electronic design having content associated therewith, wherein the content includes at least one of IP content and metal fill content. The method may also include partitioning (604) the electronic design into a grid-based bitmap, wherein each grid includes a unique identifier. The method may further include expanding (606) a length and width of each grid by a pre-determined amount and determining (608) if the expanded grid includes unextractable nets. If the expanded grid includes unextractable nets, the method may include discarding (610) all of the shapes associated with the expanded grid. The method may also include modeling (612) the electronic design, wherein modeling is spatially aware in a horizontal and vertical direction.

In some embodiments, the spatial modeling approach described herein may be used as a complementary and/or alternative approach to the electrical modeling approach. Accordingly, the spatial modeling approach of parasitic extraction process 10 may be configured to analyze the design (including all its metal layers and associated shapes) into a grid-based bitmap. The process may then filter out one or more shapes based on non-interference of the shapes to its neighboring grids.

In some embodiments, the design may be partitioned into grids (usually uniform) with an unique identifier for each grid. The size of the grid may be an optimal, heuristic number, which may be based upon a number of factors, some of which may include, but are not limited to, the geometric dimension of the design as well as a computation requirement for the filtering task.

Referring again to FIGS. 4-5, for each grid, the spatial modeling approach of parasitic extraction process 10 may be configured to expand the length and width of the grid by a pre-computed amount. The expansion may address the threshold of interference between extractable nets between adjacent grids. If there are no extractable nets (which may be referred to as 'white nets') in the expanded grid, the grid may be marked 'gray'. In this particular example, all of the gray shapes may be discarded (e.g., IP or FILL in the 'gray' grids).

In some embodiments additional modeling may be performed that takes into account multiple layers in each grid. This modeling may be spatially aware, that is non extractable shapes are exclusively grouped across the design space including multiple layers, keeping configurable spatial separation between neighboring extractable shapes. This modeling is thus spatially aware in the horizontal (e.g., x, y) direction and even in vertical (e.g., z) direction.

In some embodiments, the spatial modeling approach may be performed before flattening of the hierarchical representation of the data, so as to limit memory usage. In some embodiments, parasitic extraction process 10 may be configured to preserve signoff accuracy of extraction results and allow for parallel exploration (e.g., with multiple CPUs) of the design while doing spatial modeling.

In some embodiments, EDA application 20 and/or parasitic extraction process 10 may support a variety of languages and/or standards. EDA application 20 may support one or more software extensions, which may provide a high-throughput channel between the testbench and the device under test (DUT), and enable automated metric driven verification of embedded software exactly as if it were another part of the DUT.

Accordingly, EDA application 20 and/or parasitic extraction process 10 may be configured to fuel testbench automation, analysis, and reuse for increased productivity. EDA application 20 may be configured to ensures verification quality by tracking industry-standard coverage metrics, including functional, transactional, low-power, and HDL code, plus automatic data and assertion checking. EDA application 20 may be configured to drive and/or guide verification with an automatically backannotated and executable verification plan. EDA application 20 may be configured to create reusable sequences and multi-channel virtual sequences on top of a multi-language verification environment and to configure existing Universal Verification Components (UVCs) or quickly constructs all-new UVCs. EDA application 20 may be configured to enable advanced debug for transaction-level models, SystemVerilog/e class libraries, transient mixed-signal, low-power, and traditional waveform analysis.

In some embodiments, EDA application 20 may supports e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators. EDA application 20 may incorporate some or all of the aspects of parasitic extraction process 10 described herein.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for parasitic extraction comprising:
    providing, using one or more processors, an electronic design having content associated therewith, wherein the content includes at least one of intellectual property ("IP") content and metal fill content;
    identifying, at a graphical user interface, at least one layer associated with a content to be modeled;
    identifying, at the graphical user interface, at least one layer associated with a content to be ignored;
    ignoring the at least one layer associated with the content to be ignored, wherein the at least one layer includes a top layer of IP content;
    discarding one or more shapes associated with the at least one layer associated with the content to be modeled;
    determining an alternative shape to replace the discarded one or more shapes, wherein the alternative shape includes a library exchange format ("LEF") obstruction shape or a rectangular metal plate if the LEF obstruction shape is not available;
    replacing each discarded shape with the LEF obstruction shape or the rectangular metal plate if the LEF obstruction shape is not available; and
    modeling the electronic design including the alternative shape, wherein the modeling is electrically aware in a horizontal direction and a vertical direction, wherein the modeling is performed during a pre-processing stage associated with a parasitic extraction phase of the electronic design.

2. The computer-implemented method of claim 1, wherein the modeling is configurable based upon, at least one of, a design process, a design pattern, and a downstream electronic design automation tool.

3. The computer-implemented method of claim 1, further comprising:
    performing parallel processing of the electronic design concurrently during the modeling.

4. The computer-implemented method of claim 1, wherein identifying at least one layer associated with the content to be ignored is based upon, at least in part, a pre-characterized electric dependency of a shape in the at least one layer with one or more shapes in an adjacent layer.

5. A non-transitory computer-readable storage medium having stored thereon instructions that when executed by a machine result in the following operations:
    providing, using one or more processors, an electronic design having content associated therewith, wherein the content includes at least one of intellectual property ("IP") content and metal fill content;
    identifying, at a graphical user interface, at least one layer associated with a content to be modeled;
    identifying, at the graphical user interface, at least one layer associated with a content to be ignored;
    ignoring the at least one layer associated with the content to be ignored, wherein the at least one layer includes a top layer of IP content;
    discarding one or more shapes associated with the at least one layer associated with the content to be modeled;
    determining an alternative shape to replace the discarded one or more shapes, wherein the alternative shape includes a library exchange format ("LEF") obstruction shape or a rectangular metal plate if the LEF obstruction shape is not available;
    replacing each discarded shape with the LEF obstruction shape or the rectangular metal plate if the LEF obstruction shape is not available; and
    modeling the electronic design including the alternative shape, wherein the modeling is electrically aware in a horizontal direction and a vertical direction, wherein the modeling is performed during a pre-processing stage associated with a parasitic extraction phase of the electronic design.

6. The computer-readable storage medium of claim 5, wherein the modeling is configurable based upon, at least one of, a design process, a design pattern, and a downstream electronic design automation tool.

7. The computer-readable storage medium of claim 5, further comprising:
    performing parallel processing of the electronic design concurrently during the modeling.

8. The computer-readable storage medium of claim 5, wherein identifying at least one layer associated with the content to be ignored is based upon, at least in part, a pre-characterized electric dependency of a shape in the at least one layer with one or more shapes in an adjacent layer.

9. A computer-implemented method for parasitic extraction comprising:
    providing, using one or more processors, an electronic design having content associated therewith, wherein the content includes at least one of intellectual property ("IP") content and metal fill content;
    partitioning, at a graphical user interface, the electronic design into a grid-based bitmap, wherein each grid includes a unique identifier;
    expanding a length and width of each grid by a predetermined amount to address a threshold of interference between extractable nets between a plurality of adjacent grids;
    determining if the expanded grid includes unextractable nets;
    if the expanded grid includes unextractable nets, discarding all of the shapes associated with the expanded grid; and
    modeling the electronic design, wherein the modeling is spatially aware in a horizontal direction and vertical direction, wherein the modeling is performed during a pre-processing stage associated with a parasitic extraction phase of the electronic design and wherein modeling is performed prior to flattening of a hierarchical representation of a portion of the electronic design in order to limit memory usage.

10. The computer-implemented method of claim 9, wherein the modeling includes an analysis of multiple layers in each grid.

11. The computer-implemented method of claim 9, further comprising:
   performing parallel processing of the electronic design concurrently during the modeling.

12. The computer-implemented method of claim 9, further comprising:
   determining a grid size based upon, at least in part, a geometric dimension of the electronic design and a computational requirement.

13. A non-transitory computer-readable storage medium having stored thereon instructions that when executed by a machine result in the following operations:
   providing, using one or more processors, an electronic design having content associated therewith, wherein the content includes at least one of intellectual property ("IP") content and metal fill content;
   partitioning, at a graphical user interface, the electronic design into a grid-based bitmap, wherein each grid includes a unique identifier;
   expanding a length and width of each grid by a pre-determined amount to address a threshold of interference between extractable nets between a plurality of adjacent grids;
   determining if the expanded grid includes unextractable nets;
   if the expanded grid includes unextractable nets, discarding all of the shapes associated with the expanded grid; and
   modeling the electronic design, wherein modeling is spatially aware in a horizontal and vertical direction, wherein the modeling is performed during a pre-processing stage associated with a parasitic extraction phase of the electronic design and wherein modeling is performed prior to flattening of a hierarchical representation of a portion of the electronic design in order to limit memory usage.

14. The computer-readable storage medium of claim 13, wherein the modeling includes an analysis of multiple layers in each grid.

15. The computer-readable storage medium of claim 13, further comprising:
   performing parallel processing of the electronic design concurrently during the modeling.

16. The computer-readable storage medium of claim 13, further comprising:
   determining a grid size based upon, at least in part, a geometric dimension of the electronic design and a computational requirement.

* * * * *